United States Patent [19]
Anderson et al.

[11] Patent Number: 4,851,892
[45] Date of Patent: Jul. 25, 1989

[54] STANDARD CELL ARRAY HAVING FAKE GATE FOR ISOLATING DEVICES FROM SUPPLY VOLTAGES

[75] Inventors: Floyd E. Anderson, Phoenix; Richard R. Hamzik, Chandler, both of Ariz.

[73] Assignee: Motorola, Inc., Schaumburg, Ill.

[21] Appl. No.: 94,246

[22] Filed: Sep. 8, 1987

[51] Int. Cl.$^4$ ............................................. H01L 27/02
[52] U.S. Cl. ........................................ 357/45; 357/42; 357/65
[58] Field of Search ............................. 357/45, 42, 65

[56] References Cited

U.S. PATENT DOCUMENTS 4,356,504 10/1982 Tozun .................................... 357/42
4,570,176 2/1986 Kolwicz ................................. 357/45

FOREIGN PATENT DOCUMENTS 60-145642 8/1985 Japan ..................................... 357/45

Primary Examiner—Andrew J. James
Assistant Examiner—David Soltz
Attorney, Agent, or Firm—Michael D. Bingham

[57] ABSTRACT

A standard cell array is disclosed having improved device isolation, customized metal routing under power busses, a gate array core cell having improved internal routing channels, and shared power busses. A fake gate is located adjacent a source or drain of a transistor within each cell, and is coupled to a supply voltage for isolating the transistors within each cell. Additional metallization strips partially overlap and extend between adjacent rows and columns, respectively, of the core cells for providing supply voltages thereto. Further metallization strips for conducting signals overlie the internal portion of the core cell and extend the entire length of the row or column of core cells.

13 Claims, 6 Drawing Sheets

STANDARD CELL ARRAY HAVING FAKE GATE FOR ISOLATING DEVICES FROM SUPPLY VOLTAGES

FIELD OF THE INVENTION

This invention relates in general to standard cell arrays and, more particularly, to a gate array core cell having improved device isolation, improved internal routing channels, shared power busses, and customized metal routing under power busses.

BACKGROUND OF THE INVENTION

To satisfy the demand for large scale digital integrated circuits, the semiconductor industry has developed three basic approaches. These include standard, off the shelf circuits; custom circuits; and semicustom arrays. The standard, off the shelf circuit provides the lowest cost option due to the quantities manufactured, but are limited in providing the flexibility for the circuit desired. The custom circuit is cost limiting unless the number of circuits desired is large. The semicustom array involves a standard array of a large number of gate circuits diffused into a chip. The metallization pattern converting these gate circuits into functional custom circuits is processed according to the customer's requirement.

Semicustom design of arrays provides the advantages as follows: the choice of specific combinations of functions on a chip; reduced lead time in requesting the finished product; cost reduction by reducing component count, power and board size; and enhancing system functions and reliability.

Semicustom arrays include both gate arrays and standard cell arrays. Gate arrays begin as a collection of unconnected transistors and resistors. Designers specify how the transistors and resistors will be interconnected according to the logic needs of a particular project.

A standard cell is a predesigned functional block that performs a specific logic function. A standard cell array comprises many of these functional blocks. A number of standard cells performing different functions are typically stored in a library. Design engineers select the combination of cells they need for an integrated circuit. The density of functions for the standard cell array is higher on the component than the gate array, and there are fewer unused transistors and interconnect areas. Standard cells also allow the designer to integrate analog and digital functions on a single chip. A standard cell library typically comprises gates (i.e., AND, OR), flip-flops (i.e., latches), special functions (i.e., voltage references, shift registers), input/output cells (i.e., three state), analog cells (i.e., oscillators, operational amplifiers), memory cells (i.e., RAM) and microcomputers.

A gate array core cell comprises a specific number of MOSFET transistors, typically eight, that are interconnected by a first of two or three layers of metal to form a specific function know as a macro cell. The second and third layer of metal are used to connect the plurality of macro cells to form a specific logic system. Each signal from transistor to transistor or from cell to cell is transferred by a metal strip within one of the metal layers. Each metal strip in a gate array is located in a routing channel. A routing channel is a dedicated area on the chip.

Conventionally, routing channels are predefined for consideration by the circuit designer. A more efficient gate array conventionally use two designs, sea-of-gates and channelless. The sea-of-gates design includes no routing channels and has metal routed over unused cells, as well as through used cells. About sixty percent of the cells are typically unusable for the sea-of-gates design. The channelless design includes no routing channels wherein metal is routed through unused cells. About forty percent of the cells are typically unusable for the channelless design.

Thus, what is needed is a core cell having improved device isolation, internal routing channels, shared power busses, and customized metal routing under power busses that provides for more efficient use of available cells.

SUMMARY OF THE INVENTION

Accordingly, it is an object of the present invention to provide an improved gate array core cell array.

Another object of the present invention is to provide a core cell having improved device isolation.

Still another object of the present invention is to provide a core cell having improved power distribution.

Another object of the present invention is to provide a core cell having improved metallization routing.

In carrying out the above and other objects of the invention in one form, there is provided a standard cell array having a fake gate located adjacent a source or drain of a transistor within each cell, and is coupled to a supply voltage for isolating the transistors within each cell. Additional metallization strips partially overlap and extend between adjacent rows and columns, respectively, of the core cells for providing supply voltages thereto. Further metallization strips for conducting signals overlie the internal portion of the core cell and extend the entire length of the row or column of core cells.

The above and other objects, features, and advantages of the present invention will be better understood from the following detailed description taken in conjunction with the accompanying drawings.

DETAILED DESCRIPTION OF THE INVENTION

Figure 1:
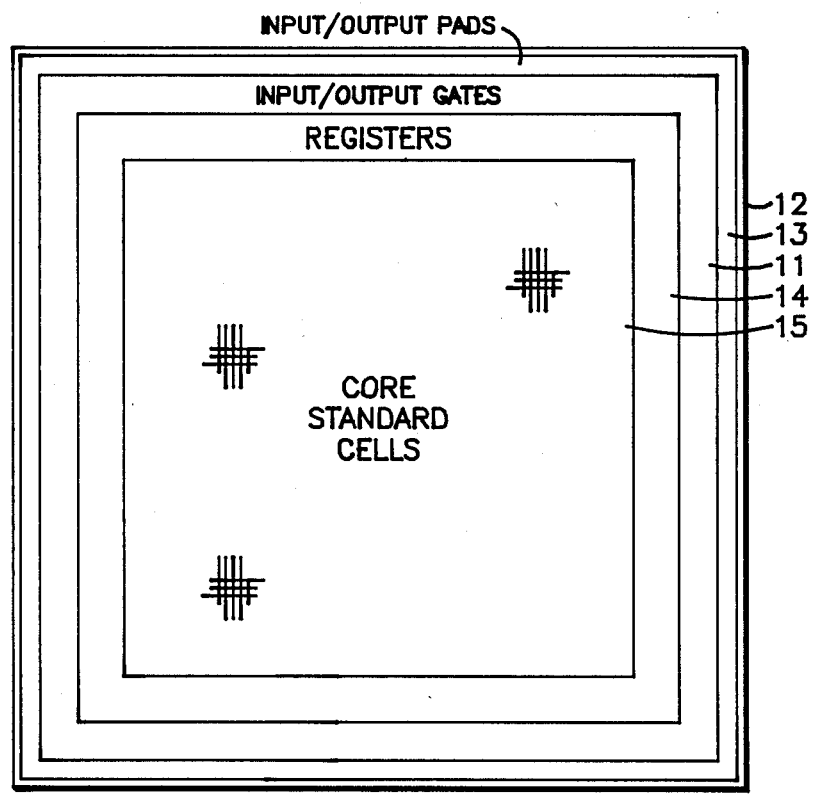
FIG. 1 shows a top view of a standard cell array in block form.

Referring to FIG. 1, a custom designable standard cell array typically includes a plurality of input/output gates 11 around the periphery of a chip 12 and which are coupled between one of a plurality of input/output pads 13 and one of a plurality of registers 14. Input/output gates 11 and registers 14 comprise one or more standard cells. A plurality of core standard cells 15 are located on an internal portion of the chip and are generally coupled to one another and to the plurality of registers. Core standard cells 15 comprise standard cells that may be connected to perform logic and other special functions such as shift registers.

Figure 2:
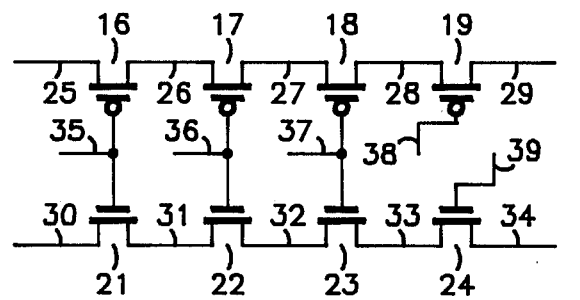
FIG. 2 shows a schematic of a standard cell.

Referring to FIG. 2, standard cell 15 is shown in schematic form as manufactured on chip 12 but before metal is applied for interconnection of the transistors within standard cell 15 and for connection to other circuitry and includes four P-channel CMOS transistors 16, 17, 18 and 19 having their source-drain current paths connected in series and four N-channel CMOS transistors 21, 22, 23 and 24 having their source-drain current paths connected in series. Transistors 16 and 17, 17 and 18, 18 and 19, 21 and 22, 22 and 23, and 23 and 24 have their drains and sources, respectively, coupled together at 26, 27, 28, 31, 32, and 33, respectively. Transistors 16 and 21, 17 and 22, and 18 and 23 have their gates 35, 36 and 37, respectively, coupled together, while transistors 19 and 24 do not have their gates 38 and 39, respectively, connected to another element. Standard cell 15 illustrated in FIG. 2 is only one embodiment of a plurality of possible embodiments that may be placed on chip 12.

Figure 3:
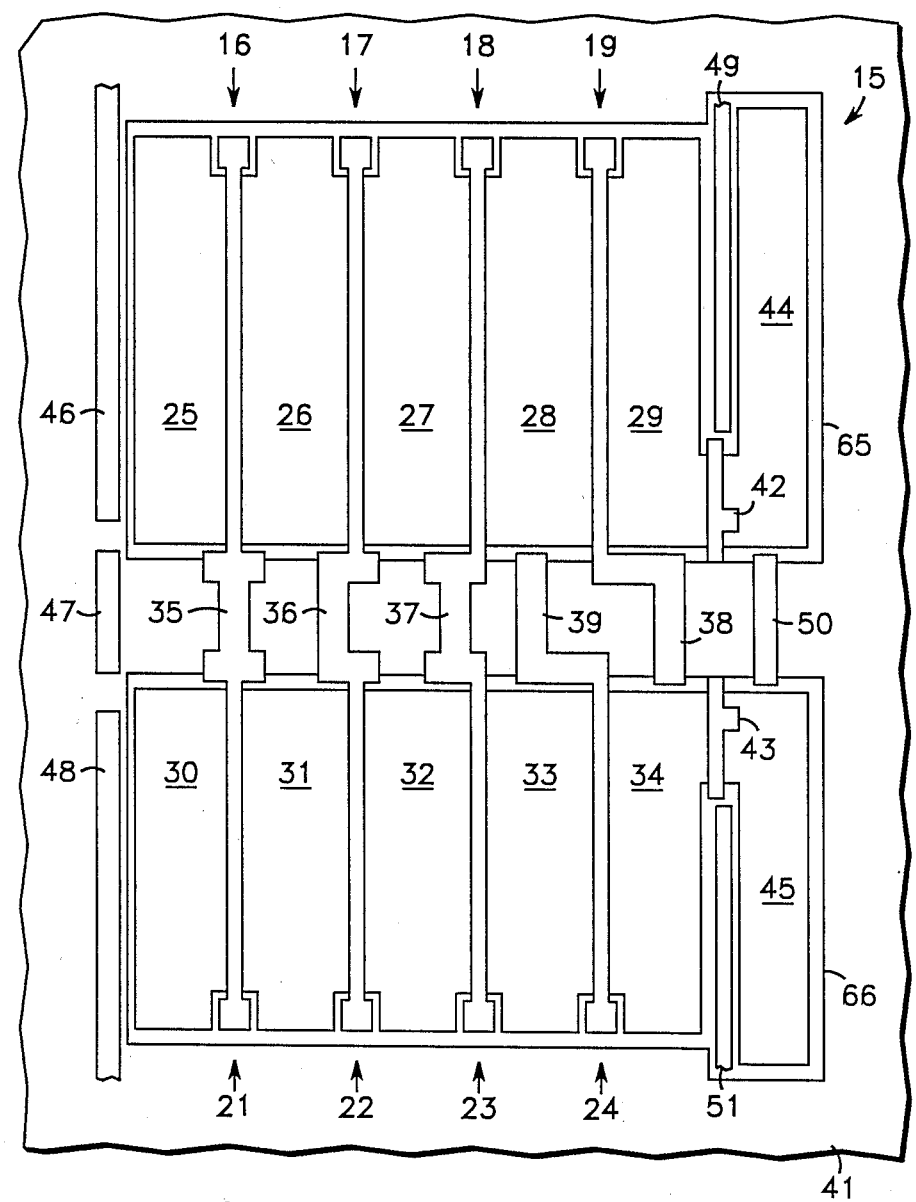
FIG. 3 shows a schematic cross-sectional plan view of a standard cell before metallization.

FIG. 3 illustrates a simplified schematic cross-sectional plan view of a standard cell approximately at the level below first metal of the standard cell of FIG. 2. Structures of FIG. 3 which are shown in FIG. 1 are identified by the numerals used to refer to them in FIG. 1. Transistors 16, 17, 18, 19, 21, 22, 23 and 24 are grown on substrate 41 in a manner well known to those skilled in the art by placing gates 35, 36, 37, 38 and 39 over a dielectric overlying a channel of substrate 41 between the source and drain regions thereof. Fake gates 42 and 43 are deposited over a dielectric overlying a channel of substrate 41 between region 29 and active region 44, and region 34 and active region 45, respectively. Fake gates 42 and 43 are connected to active regions 44 and 45, respectively, by a buried region, and are separated from regions 29 and 34, respectively, by a trench (not shown). Additionally, crossunder regions 46, 47, 48, 49, 50 and 51 are provided for reasons to be explained hereinafter and are isolated from other elements as well as each other by a trench. Source and drain regions 25, 26, 27, 28, 29, 30, 31, 32, 33 and 34 as well as active regions 44 and 45 are typically grown on N-well 65 and P-well 66, wherein the wells 65 and 66 are further grown on substrate 41 and comprise one or more semiconductor materials such as silicon. Gates 16, 17, 18, 19, 21, 22, 23 and 24 and jumpers 46, 47, 48, 49, 50 and 51 typically comprise a polysilicon. A trench (not shown) separates P-regions 25, 26, 27, 28, 29 and 45 from N-regions 30, 31, 32, 33, 34 and 44, as well as each of gates 35, 36, 37, 38, 39, 42 and 43 and underpass regions 46, 47, 48, 49, 50 and 51.

Figure 4:
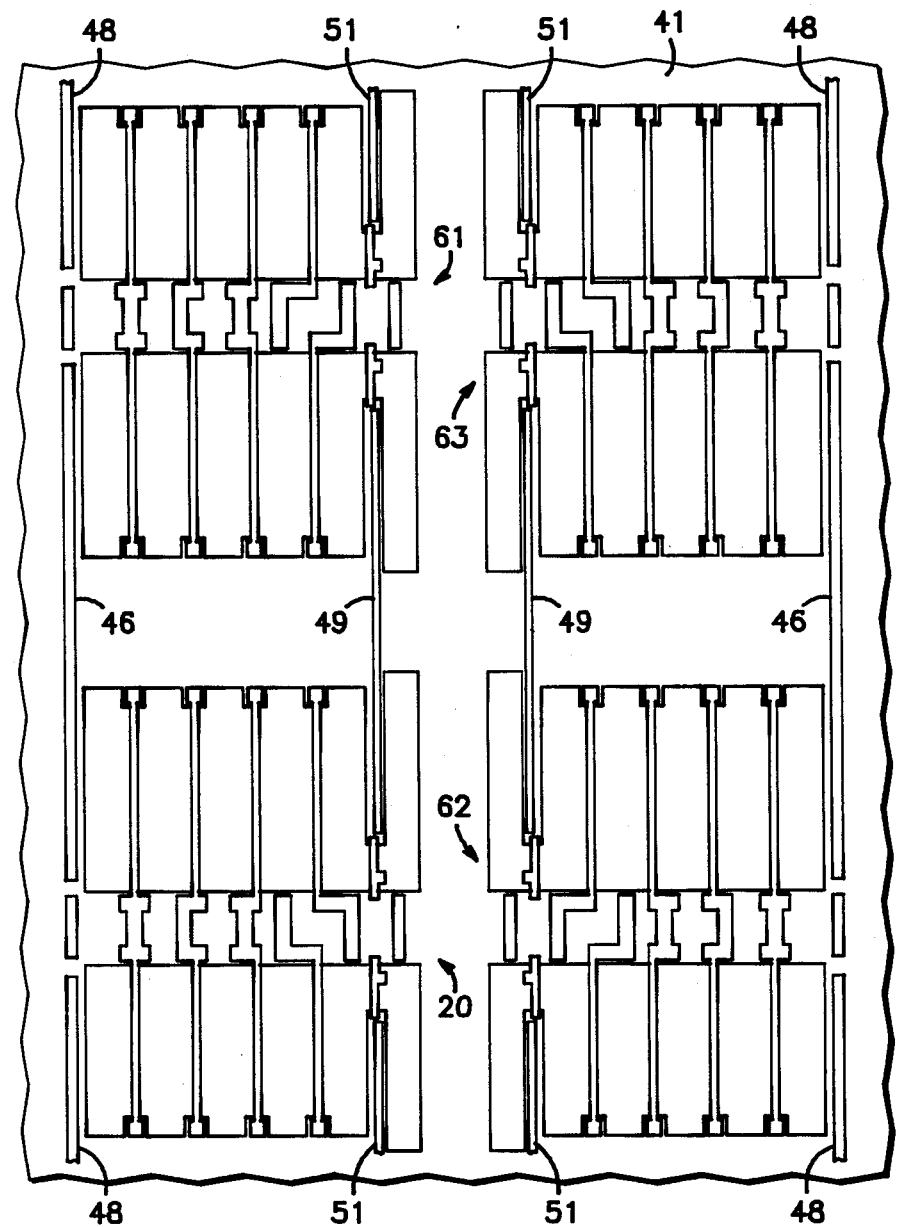
FIG. 4 shows a schematic cross-sectional plain view of four adjacent standard cells before metallization.

Referring to FIG. 4, standard cell 20 is adjacent to standard cells 61, 62 and 63 in the matrix of standard cells 15. Standard cells 61, 62 and 63 are identical to standard cell 20 but are "mirrored" in their layout on chip 41. Cross under regions 46 and 49 extend between standard cells 20 and 61, and standard cells 62 and 63, respectively. Similarly, cross under regions 48 and 51 extend into additional adjacent standard cells not shown in the figure.

Figure 5A:
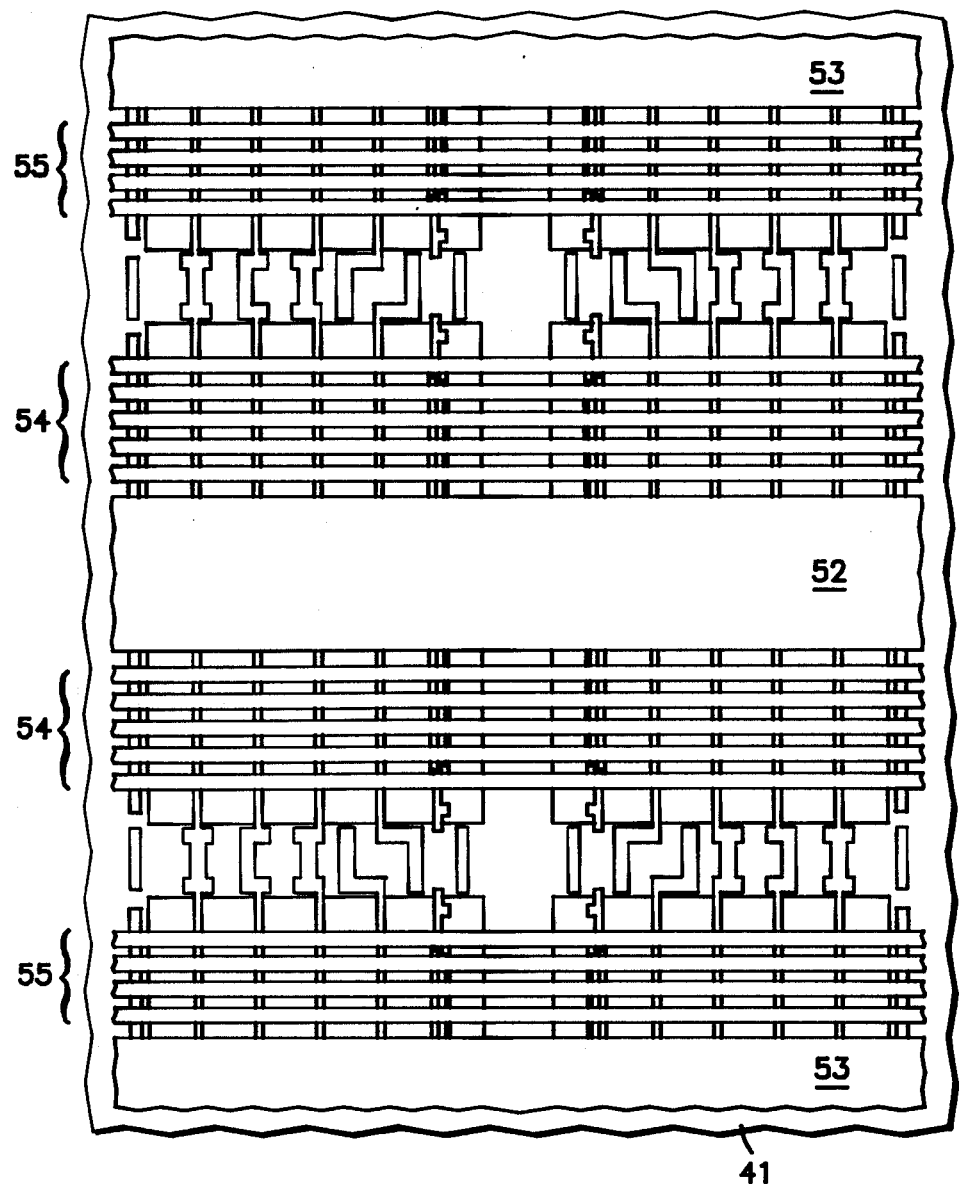
FIGS. 5A–5C shows the standard cells of FIG. 4 including an additional first, second and third layer of metal, respectively.
Figure 5B:
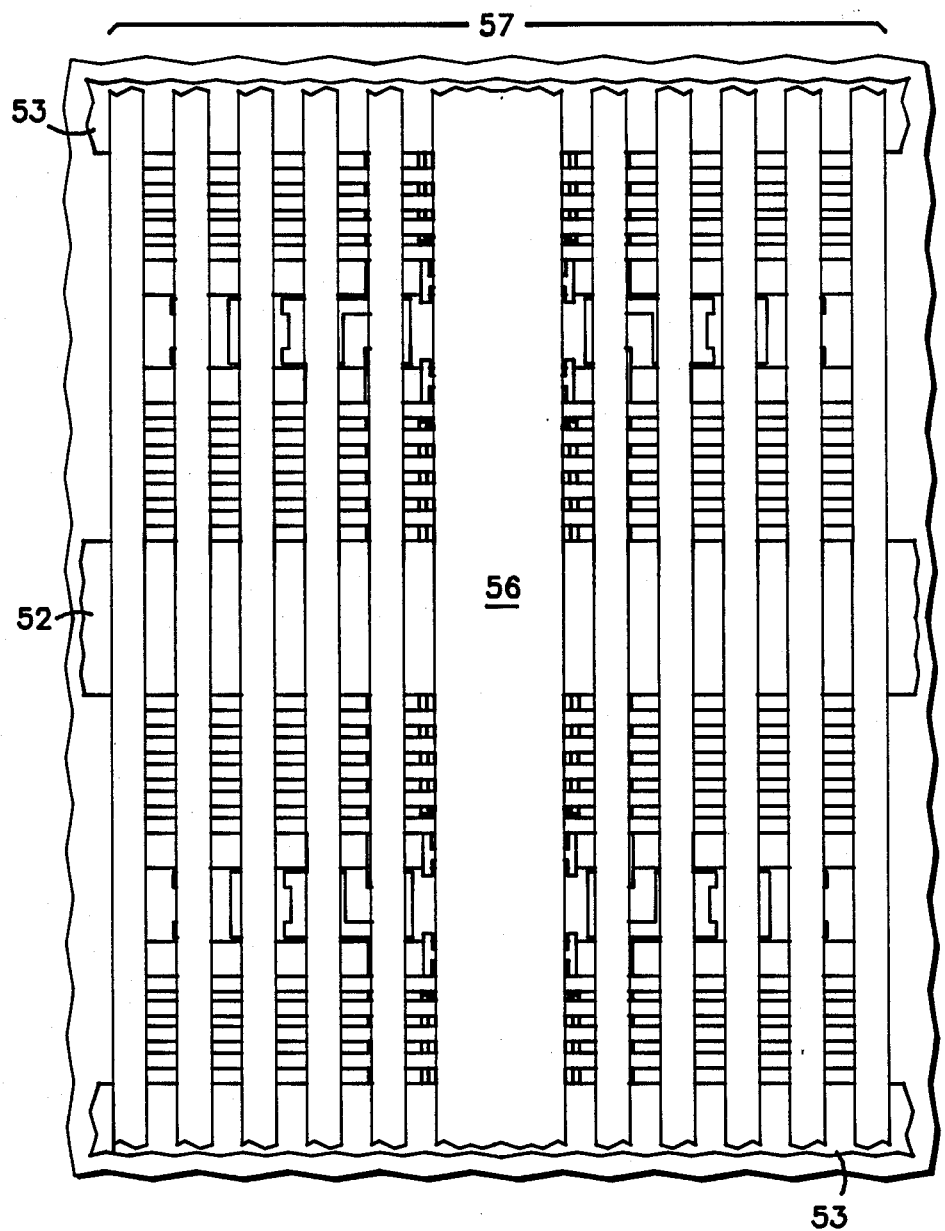
Figure 5C:
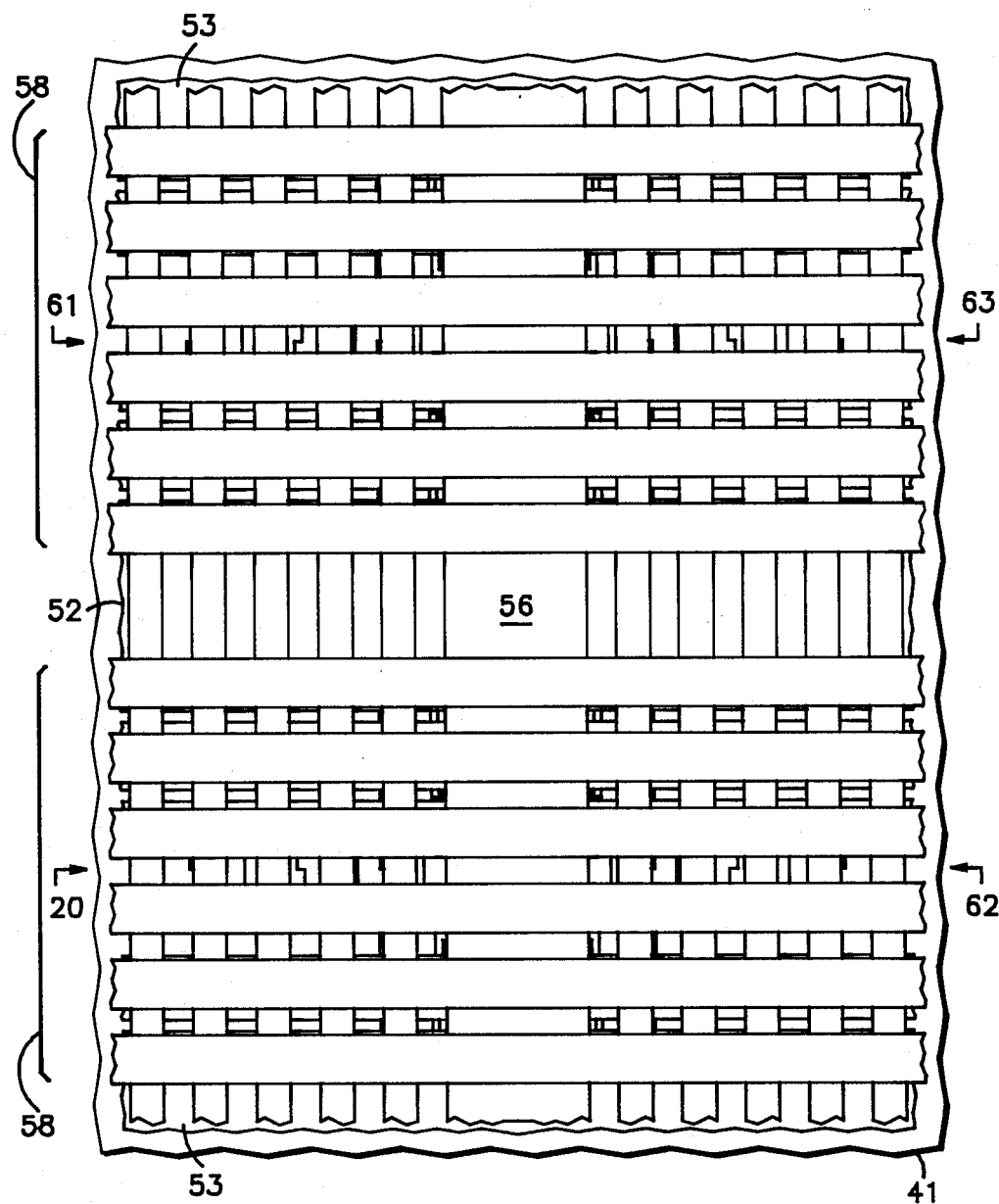

FIGS. 5A, 5B, and 5C illustrate how first, second and third layers of metal, respectively, are placed over the structure of FIG. 4 in order to carry out the objects of the present invention. The first layer of metal (FIG. 5A) is deposited on a surface of a first oxidation (not shown) and includes $V_{DD}$ power bus 52, $V_{SS}$ power bus 53, and five routing channels 54 overlying transistors 16, 17, 18 and 19 and four routing channels 55 overlying transistors 21, 22, 23 and 24. The second layer of metal (FIG. 5B) is deposited on a surface of a second oxidation (not shown) and includes power bus 56 and five routing channels 57. The third layer of metal (FIG. 5C) is deposited on a surface of a third oxidation (not shown) and includes six routing channels 58. The width and number of routing channels 54, 55, 57 and 58 are limited only by the process used to manufacture the chip and not the concepts provided herein.

Fake gates 42 and 43 provide isolation from the active devices while providing a method of tying down the well containing transistors 16, 17, 18, 19 and 21, 22, 23, 24, respectively, and substrate 41. Fake gates 42 and 43 are always turned "off". Fake gate 42 is tied to $V_{DD}$ by contacting the active area 44 on its right side with a buried contact. Active area 44 is connected to $V_{DD}$ by the $V_{DD}$ power bus at the top of the core cell 15. Because the active areas and polysilicon are sallicided, they provide a low resistance path for signals. This results in active area 44 being isolated from transistors 16, 17, 18 and 19 by fake gate 42. Active area 44 now provides the well tie down for the N-well of P-channel transistors 16, 17, 18 and 19. By using fake gate 42 and active area 44 in this manner, it is possible to provide well tie downs with out using first layer metal interconnect. This leaves routing channels 54 on first metal open for local and global routing which improves the routability of the chip. Local routing is the metal interconnections within a macro cell and global routing is the metal interconnections between macro cells. Fake gate 43 provides the same function as fake gate 42, except that it provides a tie down to the P-well for N-channel transistors 21, 22, 23 and 24.

A better understanding of how power busses 52, 53 and 56 are shared with adjacent cells can be gained from an examination of FIG. 4. $V_{DD}$ power bus 52 overlies cells 20, 61, 62, and 63 for supplying voltage $V_{DD}$ thereto. $V_{SS}$ power buss 53 overlies cells 20 and 62 for supplying voltage $V_{SS}$ thereto. Power bus 56 overlies cells 20, 61, 62, and 63 and may be connected to either $V_{DD}$ power bus 52 or $V_{SS}$ power bus 53 for supplying the appropriate voltage thereto. The sharing of power busses in this manner, instead of the conventional way of placing power busses over the center of the cell, reducing the number of power busses on each chip and allowing for wider power busses.

This method of power bus distribution also reduces the area on chip required for power busses by reducing the number of metal-space-metal pairs (i.e., adjacent routing channels 54). This increases the number of tracks available for interconnect which again improves routability. It is normally necessary to run large power busses through the array to provide adequate current density capabilities. These large power busses break up the array then into several smaller arrays. This is not desirable because the place and route software is constrained as to where it can place large blocks of logic. With the method of power bus distribution used in this invention, there are no large power busses required since adequate current density capabilities are provided within the cell. This makes the array more versatile for place and route. This becomes more critical as arrays get larger and macro cells become more complex. This also makes it easier to automate the design of new array sizes since power busses need not be considered. When personalizing macro cells it is often necessary to tie some gates to the power supplies. In conventional core cell designs it is necessary to contact the gate in the center of the cell (area 35, 36, 37, 38 and 39) and run second metal to the first metal power bus. This is undesirable because the second metal forms a blockage to global second metal routing. In the present design, contacting a gate to the power bus requires only a contact at the end of the gate since the power busses run over the top of the ends of the gates. Hence no second metal is required and routing efficiency is improved.

Underpass regions 46, 47, 48, 49, 50 and 51 are used as local routing for core cell personalizations. Because the power supply metal $V_{DD}$ and $V_{SS}$ is at the top and bottom of the cell it would normally require second metal to cross over them. The poly silicon tracks are used to cross under the power supply lines (i.e., from cell 20 to cell 61). This has two advantages. First, it is used in the place of second metal which again improves routability. Second, it allows macro cell personalizations easily in the "y" direction instead of just in the "x" direction. This produces more square macro cells which are easier to place and shorter interconnect lengths which improves performance.

Personalizing a macro cell is normally accomplished with the five intermost first metal tracks 54 (FIG. 5A) and the polysilicon tracks 46, 47, 48, 49, 50 and 51. This leaves all of the second metal tracks, as well as the first metal tracks 54 and 55, open for global routing. It is now possible to go across the entire "x" direction of the chip on first metal tracks 54 and 55, whether personalized macro cells are placed in the way or not. This effectively increases the number of tracks for global routing by approximately thirty percent. This clearly improves the usefulness of the gate array making it more competitive with other forms of integrated circuits.

By now it should be appreciated that there has been provided a standard cell having improved device isolation, improved internal routing channels, shared power busses and customized metal routing under power busses.

We claim:

1. A gate array utilizing trench isolation techniques comprising a plurality of standard cells monolithically integrated on a first layer of said gate array and a plurality of input/output pads disposed on the periphery of said gate array, said standard cells arranged in rows and columns, each said standard cell including an active region having a first conductivity type formed within a well having a second conductivity type defining a plurality of transistors interconnected in a predetermined arrangement wherein said active region forms the source or drain of at least one of said plurality of transistors and first means disposed within said standard cell for tying down said well and adjacent to said active region for applying a first voltage to said well wherein local and global routing channels are left open and isolating said first voltage from said active region when said active region is sallicided, and second means coupled between selected ones of said plurality of transistors and other selected ones of said plurality of transistors and selected ones of said input/output pads for transmitting signals and said first voltage and a second voltage therebetween and coupled to said first means for supplying said first voltage thereto.

2. The gate array according to claim 1 wherein said first means comprises:
a fake gate disposed adjacent and separate from one of a source or drain of one of said transistors.

3. The gate array according to claim 2 wherein said second means comprises:

third means partially overlapping said plurality of transistors and extending between adjacent rows of said cells and selectively coupled to said plurality of transistors for supplying said first and second voltages thereto; and fourth means overlying said third means and partially overlapping said first means and extending between adjacent columns of said cells and coupled to said third means for supplying said first and second voltage thereto.

4. The gate array according to claim 3 further comprising fifth means underlying said fourth means and overlying one of said rows of cells and selectively interconnected between said plurality of transistors and said input/output pads for supplying signals therebetween.

5. The gate array according to claim 4 further comprising sixth means overlying both said third means and one of said columns of cells and selectively interconnected between said plurality of transistors, said third means and said input/output pads for supplying said signals therebetween.

6. The gate array according to claim 5 wherein each of said third, fourth, fifth and sixth means comprise a plurality of conductive strips.

7. The gate array according to claim 6 wherein said conductive strips of said fifth means extend substantially the entire length of said respective row.

8. The gate array according to claim 3 wherein said third means comprises a first plurality of conductive strips for supplying a first voltage and a second plurality of conductive strips for supplying a second voltage, wherein said conductive strips of each said first and second plurality of conductive strips alternatively overlap and extend between adjacent rows of said cells.

9. The gate array according to claim 8 wherein said fourth means comprises a third plurality of conductive strips for supplying said first voltage and a fourth plurality of conductive strips for supplying said second voltage, wherein said conductive strips of each said third and fourth plurality of conductive strips alternatively overlap and extend between adjacent columns of said cells.

10. A semiconductor integrated circuit comprising:
a substrate;
a plurality of input/output pads disposed on said substrate;
a plurality of standard cells disposed on said substrate, said plurality of standard cells arranged in a plurality of rows and a plurality of columns, adjacent standard cells being mirrored relative to each other, each standard cell comprising:
a plurality of MOS transistors having a first conductivity type, each transistor having a gate, a drain and a source;
an active region having a second conductivity type overlying said substrate for tying down said substrate and separated from said plurality of MOS transistors; and
a fake gate connected to said active region by a buried region and separated from and disposed adjacent to one of said drains and sources of said plurality of MOS transistors wherein local and global routing channels are left open;
a first layer of metal comprising:
a first plurality of metal strips overlying one of said row of cells, said first plurality of metal strips selectively interconnected between said plurality of transistors and and said input/output pads; and a second plurality of metal strips partially overlapping said plurality of MOS transistors and extending between said rows of standard cells and selectively coupled to said plurality of transistors and coupled to said active region for supplying a supply voltage thereto; and a second layer of metal overlying said first layer of metal comprising:

a third plurality of metal strips overlying one of said columns of said cells, said third plurality of metal strips selectively interconnected between said plurality of transistors and said first plurality of metal strips; and a fourth plurality of metal strips partially overlapping said active regions and extending between said columns of standard cells and selectively coupled to said second plurality of metal strips for supplying said supply voltage thereto.

11. The semiconductor integrated circuit according to claim 11 further comprising a third layer of metal overlying said second layer of metal comprising a fifth plurality of metal strips overlying one of said rows of said cells, said third plurality of metal strips selectively interconnected between said plurality of transistors and said first and third plurality of metal strips.

12. The semiconductor integrated circuit according to claim 10 wherein said first plurality of metal strips extend substantially the length of said row of cells.

13. The semiconductor integrated circuit according to claim 10 wherein said third plurality of metal strips extend substantially the length of said column of cells.

* * * * *